United States Patent
Song et al.

(10) Patent No.: US 7,394,104 B2
(45) Date of Patent: *Jul. 1, 2008

(54) SEMICONDUCTOR OPTICAL DEVICE HAVING CURRENT-CONFINED STRUCTURE

(75) Inventors: Hyun Woo Song, Daejeon (KR); O Kyun Kwon, Daejeon (KR); Won Seok Han, Daejeon (KR); Sang Hee Park, Daejeon (KR); Jong Hee Kim, Daejeon (KR); Jae Heon Shin, Daejeon (KR); Young Gu Ju, Daejeon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/698,418

(22) Filed: Jan. 25, 2007

(65) Prior Publication Data

US 2007/0120206 A1    May 31, 2007

Related U.S. Application Data

(63) Continuation of application No. 10/699,127, filed on Oct. 30, 2003, now Pat. No. 7,230,276.

(30) Foreign Application Priority Data

Nov. 11, 2002  (KR) ............................... 2002-69586

(51) Int. Cl.
*H01L 27/15* (2006.01)

(52) U.S. Cl. ........................ 257/79; 257/98; 372/46.013

(58) Field of Classification Search .................... 257/79, 257/94, 95, 96, 98, 104, 623, 656; 372/46.013
See application file for complete search history.

(56) References Cited

U.S. PATENT DOCUMENTS

| | | | |
|---|---|---|---|
| 5,262,360 A | 11/1993 | Holonyak, Jr. et al. | |
| 5,327,448 A | 7/1994 | Holonyak, Jr. et al. | |
| 5,403,775 A | 4/1995 | Holonyak, Jr. et al. | |
| 5,493,577 A * | 2/1996 | Choquette et al. | 372/46.013 |
| 5,496,597 A | 3/1996 | Soininen et al. | |
| 5,550,081 A | 8/1996 | Holonyak, Jr. et al. | |
| 5,581,571 A | 12/1996 | Holonyak, Jr. et al. | |
| 5,719,891 A | 2/1998 | Jewell | |
| 6,965,626 B2 * | 11/2005 | Tatum et al. | 372/87 |

(Continued)

FOREIGN PATENT DOCUMENTS

JP       04-186787        3/1992

(Continued)

OTHER PUBLICATIONS

Sun Jin Yun,, et al., "Large-Area Atomic Layer . . . and $H_2O$", Journal of the Korean Physical Society, vol. 33, Nov. 1998, pp. S170-S174.

(Continued)

*Primary Examiner*—Mark Prenty
(74) *Attorney, Agent, or Firm*—Blakely, Sokoloff, Taylor & Zafman LLP

(57) ABSTRACT

Provided is a semiconductor optical device having a current-confined structure. The device includes a first semiconductor layer of a first conductivity type which is formed on a semiconductor substrate and includes one or more material layers, a second semiconductor layer which is formed on the first semiconductor layer and includes one or more material layers, and a third semiconductor layer of a second conductivity type which is formed on the second semiconductor layer and includes one or more material layers. One or more layers among the first semiconductor layer, the second semiconductor, and the third semiconductor layer have a mesa structure. A lateral portion of at least one of the material layers constituting the first semiconductor layer, the second semiconductor layer, and the third semiconductor layer is recessed, and the recess is partially or wholly filled with an oxide layer, a nitride layer or a combination of them. The semiconductor optical device having the current-confined region is mechanically reliable, highly thermally conductive, and commercially preferable and can be used in a wavelength range for optical communications.

11 Claims, 5 Drawing Sheets

U.S. PATENT DOCUMENTS

| | | | | |
|---|---|---|---|---|
| 7,230,276 B2 * | 6/2007 | Song et al. | ............... | 257/79 |
| 2004/0099857 A1 * | 5/2004 | Song et al. | ............... | 257/12 |

FOREIGN PATENT DOCUMENTS

| | | |
|---|---|---|
| JP | 11-008436 | 12/1999 |
| JP | 2000-151016 | 5/2000 |
| JP | 2000-332355 | 11/2000 |
| KR | 1020000033401 | 6/2000 |

OTHER PUBLICATIONS

E. Hall, et al., "Selectively Etched Undercut Apertures . . . VCSELs", IEEE Photonics Technology Letters, vol. 13, No. 2, Feb. 2001.

E.A. Buell, et al., "InP-based 1310-1550nm Lattice-matched VCSELs", 0-7803-7105-4/01/ 2001 IEEE, pp. 447-449.

E.Hall et al., "Room-temperature, CW operation of lattice-matched long-wavelength VCSELs", Electronics Letters Aug. 17, 2000, vol. 36, No. 17, pp. 1465-1467.

Sun Jin Yun, "Dependence of atomic layer-deposited . . . and $AlCl_3$", J.Vac.Sci.Technol. A 15(6), Nov./Dec. 1997, pp. 2993-2997.

Markus Ortsiefer, et al., "90° C. Continuous-Wave . . . Surface-Emitting Lasers", IEEE Photonics Technology Letters, vol. 12, No. 11, Nov. 2000, pp. 1435-1437.

* cited by examiner

SEMICONDUCTOR OPTICAL DEVICE HAVING CURRENT-CONFINED STRUCTURE

The present patent application is a Continuation of application Ser. No. 10/699,127, filed Oct. 30, 2003 and assigned U.S. Pat. No. 7,230,276, which claims the priority of Korean Patent Application No. 2002-69586, filed on Nov. 11, 2002, in the Korean Intellectual Property Office, the disclosure of which is incorporated herein in its entirety by reference.

BACKGROUND OF THE INVENTION

1. Field of the Invention

The present invention relates to semiconductor optical devices, and more particularly, to a semiconductor optical device having a current-confined structure.

2. Description of the Related Art

Typically, semiconductor optical devices are applicable in various fields owing to their long lifetime and high optical conversion efficiency. In particular, the semiconductor optical devices have attracted considerable attention as active devices such as light sources, for communications with a wavelength range of 1.2 to 1.7 μm, and detectors. In such a semiconductor optical device, a gain region is formed between semiconductor layers of opposite types, i.e., a p-type semiconductor layer and an n-type semiconductor layer, which are typically grown over InP or GaAs substrates, and a current-confined structure is formed in at least one of the semiconductor layers. Then, electrodes are formed on the upper and lower semiconductor layers so as to operate the optical device. The current-confined structure performs a very important function for the operation of the optical device.

The current-confined structure of the semiconductor optical device can be formed by various conventional methods. For example, a method of laterally oxidizing an Al(Ga)As semiconductor layer using wet oxidization, a method of laterally oxidizing an InAlAs layer or an AlAsSb layer using wet oxidization, a method of forming an undercut current-confined region by etching a semiconductor layer, a method of performing an ion implantation process and an annealing process, and a method of etching an adjacent portion of a tunnel junction and performing a re-growth process have been employed.

However, the foregoing methods of forming a current-confined structure of a semiconductor optical device have the following problems.

Firstly, a semiconductor optical device having a current-confined structure that is formed by laterally oxidizing an AlAs layer using wet oxidization has excellent characteristics. However, in this method, a gain medium grown over a GaAs substrate cannot reliably provide a wavelength range of longer than 1 μm. Therefore, a new method of forming a current-confined structure applicable in a long-wavelength range of approximately 1.55 μm is required.

Secondly, a current-confined structure, obtained by laterally oxidizing an InAlAs layer or an AlAsSb layer using wet oxidization, is commercially adverse because the wet oxidization should be performed at a high temperature of 500° C. for quite a long time and a crystal growth including Sb is required. Thirdly, the method of forming an undercut current-confined region by selectively etching a semiconductor layer makes the semiconductor optical device mechanically unreliable.

Fourthly, when a current-confined structure is formed using an ion implantation process and an annealing process, it is difficult to cure crystalline structures formed in an unwanted region. Finally, the method of etching an adjacent portion of a tunnel junction and performing a re-growth process is very complicated and tends to get good results only from optical devices grown using commercially adverse molecular beam epitaxy.

SUMMARY OF THE INVENTION

The present invention provides a semiconductor optical device having a current-confined structure which can be used in a wavelength range for optical communications and is mechanically reliable, highly thermally conductive, and commercially preferable.

In accordance with an aspect of the present invention, there is provided a semiconductor optical device comprising a first semiconductor layer of a first conductivity type which is formed on a semiconductor substrate and includes one or more material layers, a second semiconductor layer which is formed on the first semiconductor layer and includes one or more material layers, and a third semiconductor layer of a second conductivity type which is formed on the second semiconductor layer and includes one or more material layers. Here, the first conductivity type is opposite to the second conductivity type. One or more layers among the first semiconductor layer, the second semiconductor layer, and the third semiconductor layer have a mesa structure. A lateral portion of at least one of the material layers constituting the first semiconductor layer, the second semiconductor layer, and the third semiconductor layer is recessed, and the recess is partially or wholly filled with an oxide layer, a nitride layer or a combination of them.

Preferably, when the first semiconductor layer is a p-type semiconductor layer, the third semiconductor layer is an n-type semiconductor layer and when the first semiconductor layer is an n-type semiconductor layer, the third semiconductor layer is a p-type semiconductor layer. The second semiconductor layer may be a p-type semiconductor layer, an n-type semiconductor layer, or an undoped semiconductor layer.

While the optical device is operated, the first semiconductor layer and the third semiconductor layer serve as confinement-conducting regions, and the second semiconductor layer serves as a gain region. The oxide layer, the nitride layer or a combination of them may be formed of $ZnO$, $MgO$, $TiO_2$, $Ta_2O_5$, $ZrO_2$, $HfO_2$, $SiO_2$, $Al_2O_3$, $Si_3N_4$, $AlN$, $AlON$ or a combination of them.

For a surface emitting optical device, at least one reflecting mirror may be further formed on the both sides of overall layers so as to be parallel with the semiconductor layers, thereby making output light perpendicular to the semiconductor layer through the reflecting mirror. For a edge-emitting optical device, at least one reflecting mirror may be further formed so as to be perpendicular to the first semiconductor layer through the third semiconductor layer, thus making output light parallel with the first semiconductor layer through the third semiconductor layer.

In accordance with another aspect of the present invention, there is provided a semiconductor optical device comprising confinement-conducting regions having semiconductor layers, each of which includes one or more material layers, and a gain region having a semiconductor layer, which is formed between the confinement-conducting regions and includes one or more material layers. The confinement-conducting region(s) and the gain region have a mesa structure. A lateral portion of at least one of the material layers constituting the semiconductor layers of the confinement-conducting regions and the gain region is recessed, and the recess is partially or wholly filled with an oxide layer, a nitride layer or a combination of them.

The oxide layer, the nitride layer or a combination of them may be formed using atomic layer deposition (ALD). The oxide layer, the nitride layer or a combination of them. The oxide layer, the nitride layer or a combination of them may be formed of ZnO, MgO, $TiO_2$, $Ta_2O_5$, $ZrO_2$, $HfO_2$, $SiO_2$, $Al_2O_3$, $Si_3N_4$, AlN, AlON or a combination of them.

The semiconductor layers constituting the confinement-conducting regions may be a p-type semiconductor layer, an n-type semiconductor layer, or a combination of them. The semiconductor layer constituting the gain region may be a p-type semiconductor layer, an n-type semiconductor layer, or an undoped semiconductor layer.

A layer including tunnel junction for hole carrier supplying may be further formed in one of the confinement-conducting regions. In this case, the confinement-conducting region has a composite conductivity type and consists of n-type and p-type semiconductor layers.

At least one reflecting mirror may be further formed so as to be parallel with the confinement-conducting regions and the gain region, thus making output light perpendicular to the confinement-conducting regions and the gain region. At least one reflecting mirror may be further formed so as to be perpendicular to the confinement-conducting regions and the gain region, thus making output light parallel with the confinement-conducting regions and the gain region.

As described above, the semiconductor optical device of the present invention has the current-confined structure which can be used in a wavelength range for optical communications and is mechanically reliable, highly thermally conductive, and commercially preferable.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
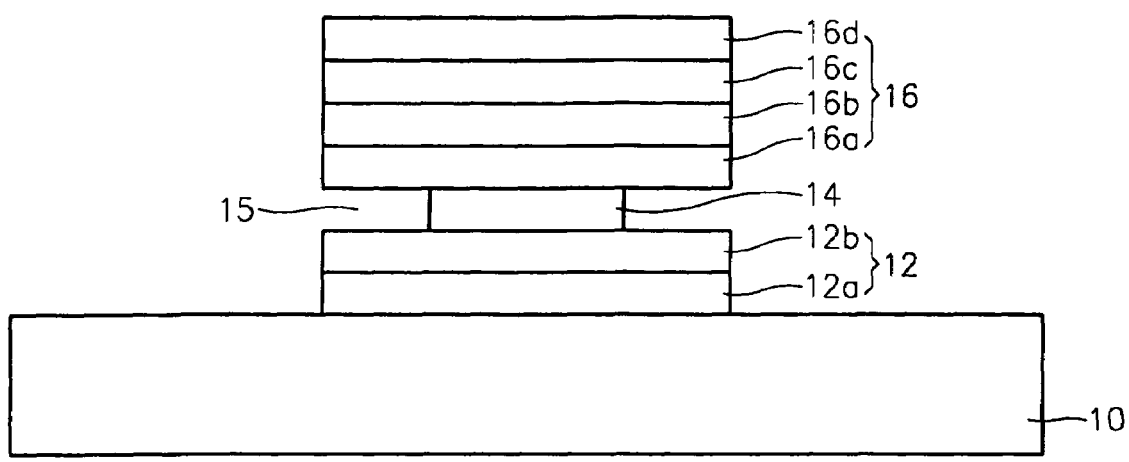
FIGS. 1 through 3 are cross-sectional views of a semiconductor optical device having a current-confined structure according to an embodiment of the present invention, for illustrating a method for fabricating the same.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, the shape of elements is exaggerated for clarity. Further, it will be understood that when a layer is referred to as being "on" another layer or substrate, it can be directly on the other layer or substrate, or intervening layers may also be present.

Figure 2:
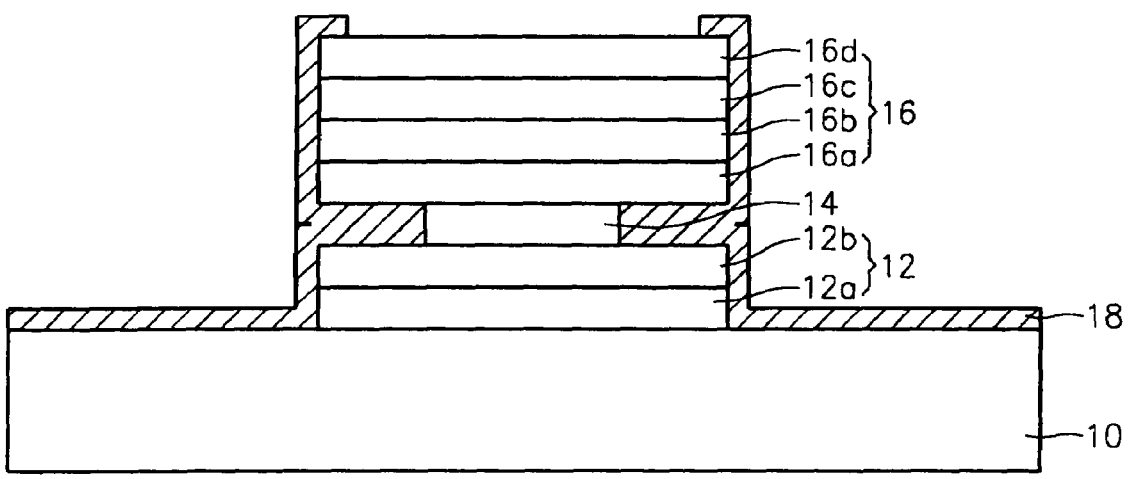
Figure 3:
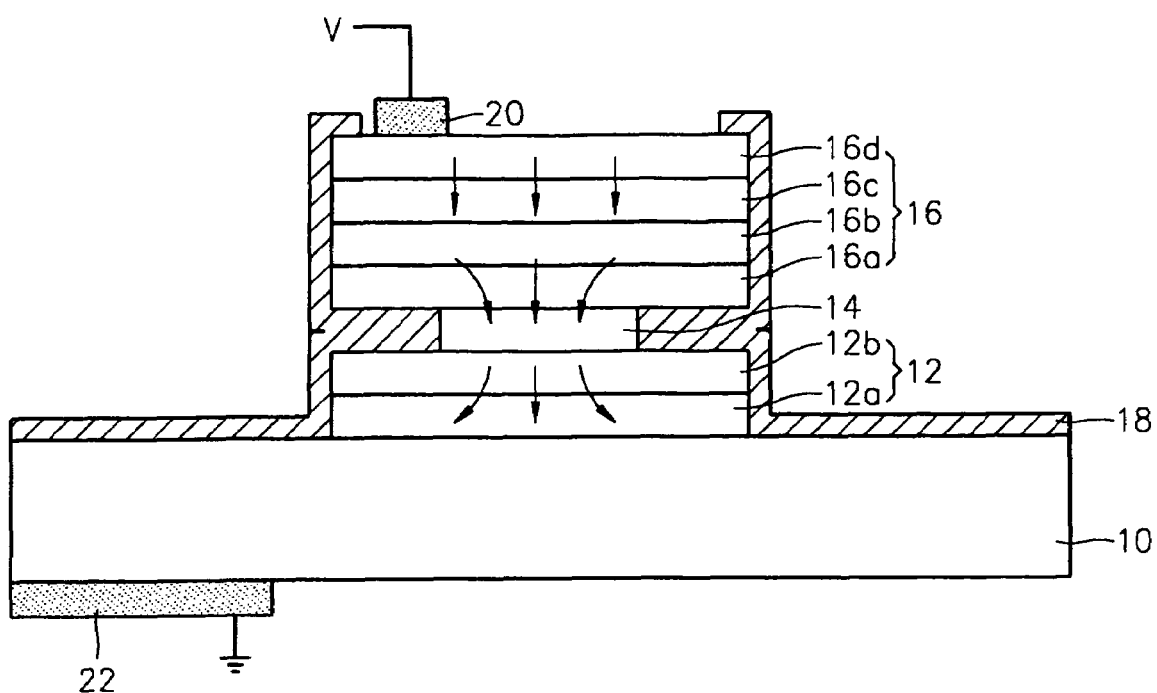

FIGS. 1 through 3 are cross-sectional views of a semiconductor optical device having a current-confined structure according to an embodiment of the present invention, for illustrating a method for fabricating the same.

Referring to FIG. 1, a first semiconductor layer 12 of a first conductivity type, for example, a p-type semiconductor layer or an n-type semiconductor layer, is formed on a semiconductor substrate 10. The semiconductor substrate 10 may be an InP substrate. While the first semiconductor layer 12 may be formed of one or more Group III-V semiconductor materials, in this embodiment, the first semiconductor layer 12 of FIG. 1 is formed of two material layers 12a and 12b for convenience. The first semiconductor layer 12 can serve as a confinement-conducting region during operations of the semiconductor optical device.

A second semiconductor layer 14 having a recess 15 is formed on the first semiconductor layer. While the second semiconductor layer 14 may be formed of one or more Group III-V semiconductor materials, in this embodiment, the second semiconductor layer 14 of FIG. 1 is formed of one material layer for convenience. The second semiconductor layer 14 may be formed of a p-type semiconductor layer, an n-type semiconductor layer, an undoped semiconductor layer, or a combination thereof. The second semiconductor layer 14 can serve as a gain region during operations of the semiconductor optical device.

A third semiconductor layer 16 of a second conductivity type, for example, an n-type semiconductor layer or a p-type semiconductor layer, is formed on the second semiconductor layer 14. Here, the second conductivity type is opposite to the first conductivity type. That is, when the first semiconductor layer 12 is a p-type semiconductor layer, the third semiconductor layer 16 is formed of n-type semiconductor material(s), and when the first semiconductor layer 12 is an n-type semiconductor layer, the third semiconductor layer 16 is formed of p-type semiconductor material(s). While the third semiconductor layer 16 may be formed of one or more Group III-V semiconductor materials, in this embodiment, the third semiconductor layer 16 of FIG. 1 is formed of four material layers 16a, 16b, 16c, and 16d for convenience. The third semiconductor layer 16 can serve as a confinement-conducting region during operations of the semiconductor optical device.

The material layers constituting the first semiconductor layer 12, the second semiconductor layer 14, and the third semiconductor layer 16 are formed of materials capable of growing over the InP substrate 10, such as InP, InGaAs, InAlGaAs, InAlAs, and InGaAsP, using metal-organic vapor phase epitaxy.

One or more layers of the first semiconductor layer 12, the second semiconductor layer 14, and the third semiconductor layer 16 have a mesa structure. Further, after forming the mesa structure, a lateral portion of the second semiconductor layer 14 is selectively etched by a wet etch process using a solvent of the phosphorus acid group or the hydrochloric acid group, thereby forming the recess 15. The recess 15 may be formed using other etching processes having a high etch selectivity with respect to the Group II-V semiconductor materials constituting the first semiconductor layer 12 and the third semiconductor layer 16. An undercut etching-profile can be controlled by adjusting the composition of the Group III-V semiconductor materials constituting the first semiconductor layer 12, the second semiconductor layer 14, and the third semiconductor layer 16. Unlike FIG. 1, the recess 15 may be formed in at least one of the material layers constituting the first semiconductor layer 12 or the third semiconductor layer 16 in place of the second semiconductor layer 14.

Referring to FIG. 2, to fill the recess 15, a highly thermally conductive oxide layer, nitride layer or a combination of them 18, is formed on the semiconductor substrate 10 and on the sidewalls of the first semiconductor layer 12, the second semiconductor layer 14 and the third semiconductor layer 16. As shown in FIG. 2, the recess 15 may be partially or wholly filled with the oxide layer, nitride layer or a combination of them 18, Etching faces exposed through the recess 15 may cause leakage current and non-radiative recombination, and this results in degradation of the semiconductor optical device. In the present invention, the oxide layer or the nitride layer] 18 is deposited on the etching faces exposed through the recess 15. Thus, degradation of the semiconductor optical device can be reduced and also, the filled the oxide layer, nitride layer or a combination of them 18 makes the semiconductor optical device mechanically reliable.

The oxide layer, nitride layer or a combination of them 18 is formed of $ZnO$, $MgO$, $TiO_2$, $Ta_2O_5$, $ZrO_2$, $HfO_2$, $SiO_2$, $Al_2O_3$, $Si_3N_4$, AlN, AlON or a combination of them. When the oxide layer, nitride layer or a combination of them 18 is formed of the aluminum oxide layer, which is highly thermally conductive as compared with the semiconductor layers, such as InAlGaAs, InGaAsP, InAlAs, and InGaAs, formed on the semiconductor substrate 10, the semiconductor optical device has excellent heat dissipation.

In particular, a light source device for optical communications, grown over a semiconductor substrate 10 like the InP, is prone to degradation due to a large gain drop with an increase in the temperature. However, the semiconductor optical device of the present invention has excellent heat dissipation, thus solving this problem. Further, if the semiconductor optical device of the present invention is used in a laser device, because the recess 15 is filled with the oxide layer, nitride layer or a combination of them 18, a difference in the refractive index between a light-emitting core region and an adjacent cladding region can be reduced. As a result, a transverse mode characteristic of laser light can be improved.

Filling the recess 15 with the oxide layer, nitride layer or a combination of them 18 employs an ALD process. In particular, when the aluminum oxide layer is formed of trimethyl aluminum (TMA) and $H_2O$ using ALD, a dense thin layer having a refractive index of about 1.67 can be deposited at a relatively low temperature of 200~400° C. The ALD process is commercially available.

Referring to FIG. 3, a first electrode 20 and a second electrode 22 are formed on the top of the third semiconductor layer 16 and on the bottom of the semiconductor substrate 10, respectively. The second electrode 22 may be formed on the first semiconductor layer 12 in place of the bottom of the overall semiconductor layers or substrate 10. As shown in FIG. 3, when a voltage is applied to the first and second electrodes 20 and 22, the arrows in the drawing indicate a current flow. The current applied to the third semiconductor layer 16 converges into the second semiconductor layer 14 and then spreads again through the first semiconductor layer 12.

Figure 4:
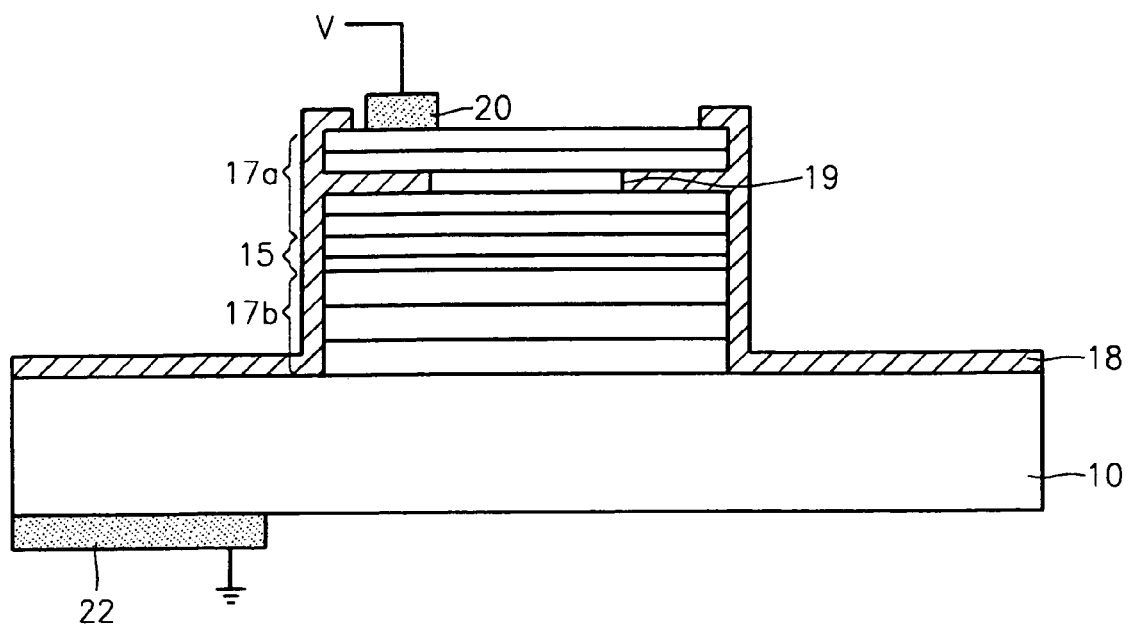
FIG. 4 are cross-sectional view of a semiconductor optical device having a current-confined structure according to another embodiment of the present invention.

FIG. 4 are cross-sectional view of a semiconductor optical device having a current-confined structure according to another embodiment of the present invention. In FIG. 4, the same reference numerals as in FIGS. 1 through 3 represent the same members.

Referring to FIG. 4, the recess 19 is formed in the layer(s) of confinement-conducting regions 17a and 17b. The confinement-conducting regions 17a and 17b are formed of five and three material layers for convenience, respectively. The gain region 15 is formed between the confinement-conducting regions 17a and 17b and neighbors opposite conductivity type semiconductor layers on each side. A layer including tunnel junction for hole carrier supplying may be further formed in one of the confinement-conducting regions 17a and 17b. In this case, a confinement-conducting regions 17a and 17b consists of n-type and p-type semiconductor layers.

Figure 5:
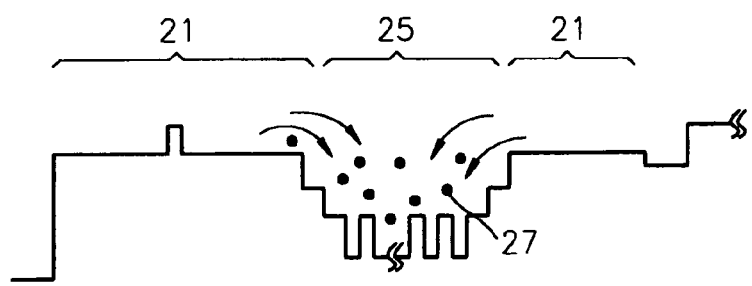
FIG. 5 is a conduction band diagram of a semiconductor optical device according to the present invention.

FIG. 5 is conduction band diagram of the semiconductor optical device according to the present invention. In FIG. 5, the same reference numerals as in FIGS. 1 through 4 represent the same members.

As shown in FIG. 5, the confinement-conducting region 21 includes a carrier confinement layers and the conducting layers for carrier injection. The injected carriers 27 from electrode 20 and 22 are confined around the gain region 25 between the confinement-conducting regions 21.

As described above, the semiconductor optical device of the present invention has the mesa structure with the recess by forming a current-flowing region, for example, the second semiconductor layer 14, using lateral selective etching. Also, in the present invention, because the recess is filled with a material having excellent insulation characteristic and thermal conductivity, the semiconductor optical device has a current-confined structure which is mechanically reliable and has excellent heat dissipation. As a result, when a voltage is applied to the electrodes of the semiconductor optical device, current can effectively flow through the second semiconductor layer. Although, in the present embodiment, the first semiconductor layer 12 and the third semiconductor layer 16 serve as confinement-conducting regions and the second semiconductor layer 14 serves as a gain region, as long as the gain region is formed between the confinement-conducting regions, the confinement-conducting regions and the gain region may be changed according to where the recess is formed.

Figure 6:
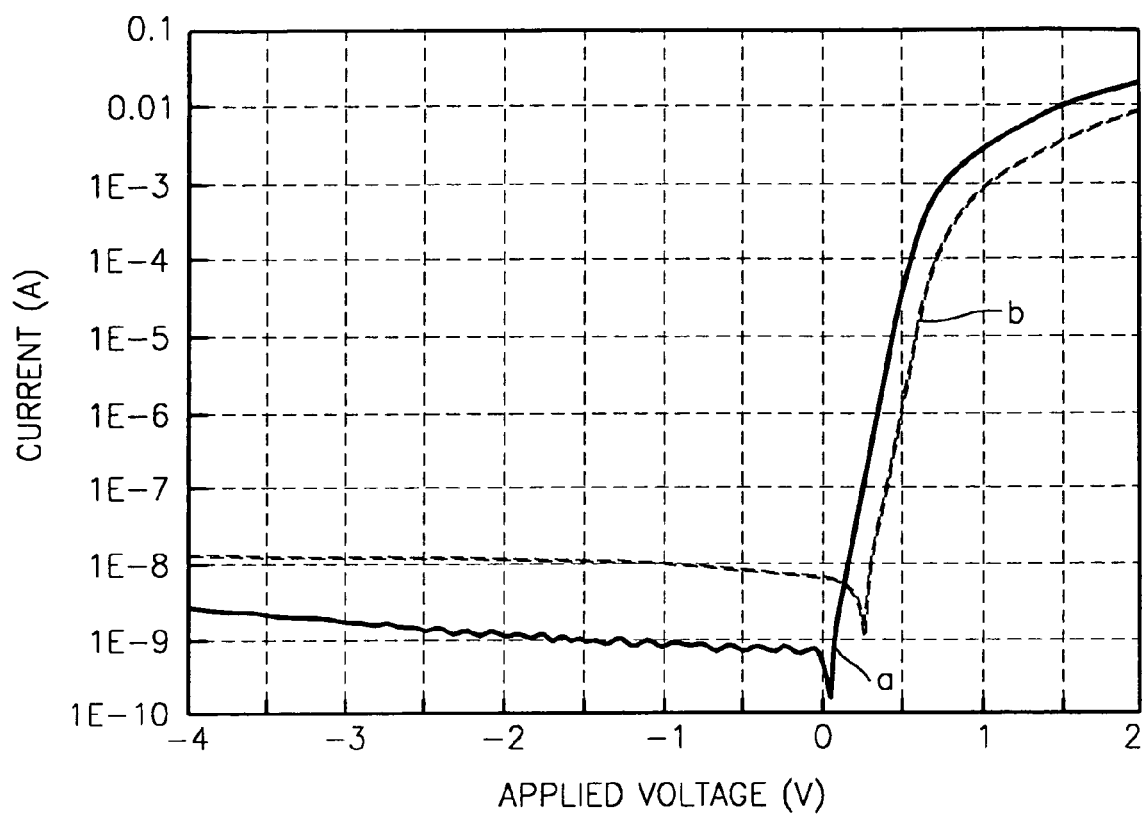
FIG. 6 is a graph showing current-voltage characteristics of the semiconductor optical device having the current-confined structure according to the present invention.

FIG. 6 is a graph showing current-voltage characteristics of the semiconductor optical device having the current-confined structure according to the present invention.

Specifically, as shown in FIG. 6, the semiconductor optical device filled with the oxide layer ($Al_2O_3$) (illustrated as a solid line and denoted by reference letter a) has lower leakage current than the semiconductor optical device not filled with the oxide layer ($Al_2O_3$) (illustrated as a dotted line and denoted by reference letter b).

Figure 7:
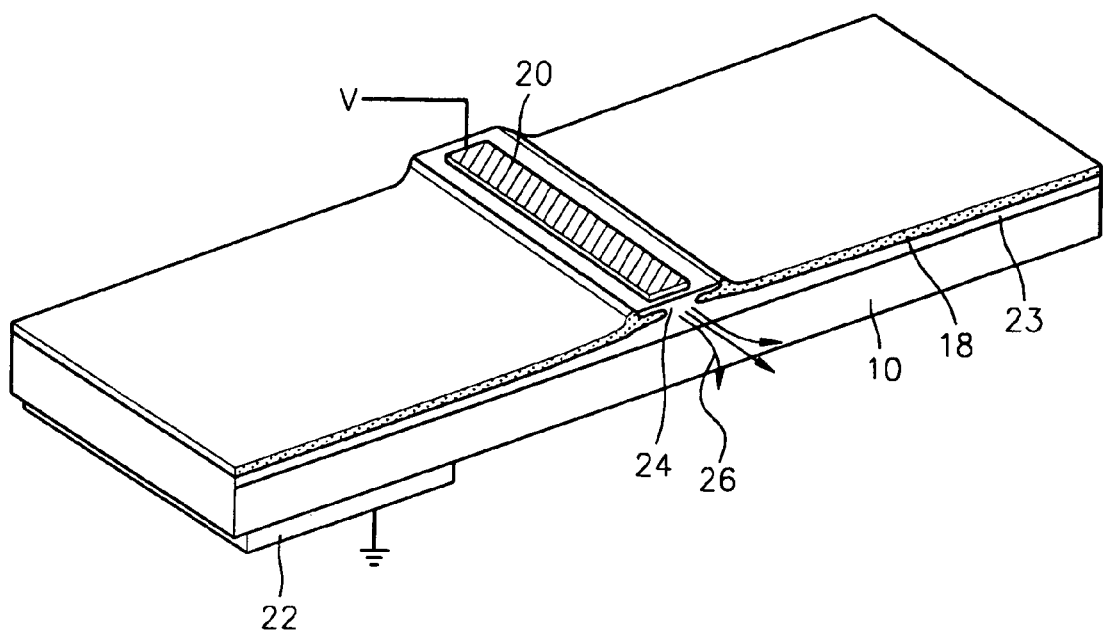
FIGS. 7 and 8 show cases where the semiconductor optical device having the current-confined structure is used in a edge-emitting optical device and a surface (bottom)-emitting optical device, respectively.
Figure 8:
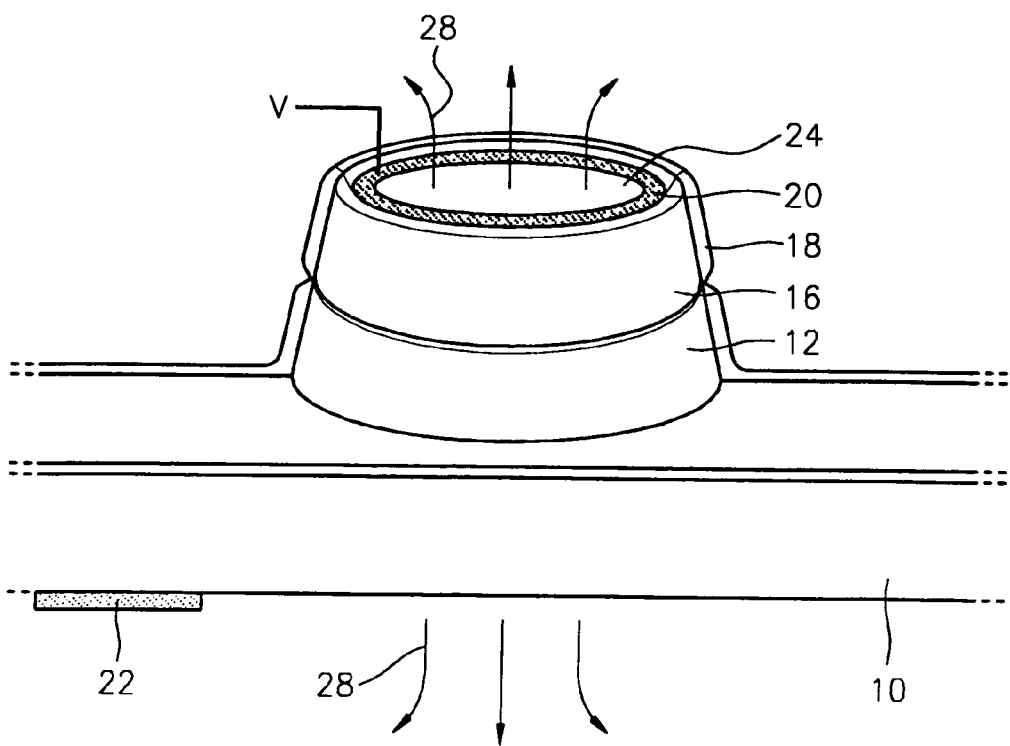

FIGS. 7 and 8 show cases where the semiconductor optical device having the current-confined structure is used in a edge-emitting optical device and a surface (bottom)-emitting optical device, respectively. In FIGS. 7 and 8, the same reference numerals as in FIGS. 1 through 3 represent the same members.

Specifically, FIG. 7 shows the edge-emitting optical device. In FIG. 7, a reflecting mirror 24 is formed so as to be perpendicular to the semiconductor layer 23, i.e., the first semiconductor layer through the third semiconductor layer 12, 14, and 16 of FIGS. 1 through 3, thereby making output light 26 parallel with the first semiconductor layer through the third semiconductor layer 12, 14, and 16. FIG. 8 shows the surface-emitting optical device. In FIG. 8, a reflecting mirror 24 is formed so as to be parallel with the first semiconductor layer through the third semiconductor layer 12, 14, and 16 of FIGS. 1 through 3, thereby making output light 28 perpendicular to the first through third semiconductor layers 12, 14, and 16.

Further, the semiconductor optical device having the current-confined structure according to the present invention can be used in edge-emitting semiconductor lasers, edge light-emitting diodes, surface-emitting semiconductor lasers, surface light-emitting diodes, light-receiving diodes, semiconductor optical amplifiers, and optical detectors.

As described above, in the semiconductor optical device according to the present invention, a semiconductor layer is selectively etched so as to form a recess, which is filled with a highly thermally conductive oxide layer, nitride layer or a combination of them. Thus, the semiconductor optical device has a current-confined structure.

As a result, the semiconductor optical device according to the present invention is mechanically reliable and highly thermally conductive. Also, because the recess is filled with the oxide layer, the nitride layer or a combination of them using ALD so as to reduce leakage current at the etching faces, the semiconductor optical device is mechanically reliable and commercially preferable.

Consequently, the semiconductor device according to the present invention has a current-confined structure suitable for a wavelength range of optical communications which is mechanically reliable, highly thermally conductive, and commercially preferable. Further, the semiconductor optical device of the present invention is applicable in various technical fields of, for example, light sources and detecting devices, optical communications, light-emitting diodes and lasers, and vertical cavity surface-emitting lasers.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A semiconductor optical device comprising:
   confinement-conducting regions having semiconductor layers, each of the confinement-conducting regions including one or more material layers; and
   a gain region having a semiconductor layer, which is formed between the confinement-conducting regions and includes one or more material layers,
   wherein the confinement-conducting regions and the gain region have a mesa structure, and a lateral portion of at least one of the material layers constituting the semiconductor layers of the confinement-conducting regions and the gain region is recessed, and the recess is formed by selectively etching the lateral portion of at least one of the material layers and the material layers surrounding the recess have different etching rates compared to at least one of the material layers constituting the semiconductor layer of the gain region, and the recess is partially or wholly filled by deposition with an oxide layer, a nitride layer or a combination of them,
   wherein at least one reflecting mirror is further formed so as to be parallel with the confinement-conducting regions and the gain region such that output light is perpendicular to the confinement-conducting regions and the gain region.

2. The device of claim 1, wherein the oxide layer or the nitride layer or a combination of them is formed using atomic layer deposition.

3. The device of claim 1, wherein the oxide layer or the nitride layer or a combination of them is formed of one of a ZnO, MgO, $TiO_2$, $Ta_2O_5$, $ZrO_2$, $HfO_2$, $SiO_2$, $Al_2O_3$, $Si_3N_4$, AlN, AlON and a combination of them.

4. The device of claim 1, wherein the semiconductor layer constituting the confinement-conducting regions is one of a p-type semiconductor layer, an n-type semiconductor layer and a combination of them.

5. The device of claim 1, wherein the semiconductor layer constituting the gain region is one of a p-type semiconductor layer, an n-type semiconductor layer, and an undoped semiconductor layer.

6. A semiconductor optical device comprising:
   confinement-conducting regions having semiconductor layers, each of which includes one or more material layers; and
   a gain region having a semiconductor layer, which is formed between the confinement-conducting regions and includes one or more material layers,
   wherein the confinement-conducting regions and the gain region have a mesa structure, and a lateral portion of at least one of the material layers constituting the semiconductor layers of the confinement-conducting regions and the gain region is recessed, and the recess is formed by selectively etching the lateral portion of at least one of the material layers and the material layers surrounding the recess have different etching rates compared to at least one of the material layers constituting the semiconductor layer of the gain region, and the recess is partially or wholly filled by deposition with an oxide layer, a nitride layer or a combination of them.

7. The device of claim 6, wherein the oxide layer, the nitride layer or a combination of them is formed using atomic layer deposition.

8. The device of claim 6, wherein the oxide layer or the nitride layer or a combination of them is formed of one of a ZnO, MgO, $TiO_2$, $Ta_2O_5$, $ZrO_2$, $HfO_2$, $SiO_2$, $Al_2O_3$, $Si_3N_4$, AlN, AlON and a combination of them.

9. The device of claim 6, wherein the semiconductor layer constituting the confinement-conducting regions is one of the group consisting of a p-type semiconductor layer, an n-type semiconductor layer and a combination of them.

10. The device of claim 6, wherein the semiconductor layer constituting the gain region is one of a p-type semiconductor layer, an n-type semiconductor layer, and an undoped semiconductor layer.

11. A semiconductor optical device comprising:
    confinement-conducting regions having semiconductor layers, each of which includes one or more material layers; and
    a gain region having a semiconductor layer, which is formed between the confinement-conducting regions and includes one or more material layers,
    wherein the confinement-conducting regions and the gain region have a mesa structure, and a lateral portion of at least one of the material layers constituting the semiconductor layers of the confinement-conducting regions and the gain region is recessed, and the recess is formed by selectively etching the lateral portion of at least one of the material layers and the material layers surrounding the recess are not selectively etched and the recess is partially or wholly filled by deposition with an oxide layer, a nitride layer or a combination of them and wherein at least one reflecting mirror is further formed so as to be perpendicular to the confinement-conducting regions and the gain region such that output light is parallel with the confinement-conducting regions and the gain region.

* * * * *